United States Patent
Tadokoro et al.

(10) Patent No.: US 12,322,467 B2
(45) Date of Patent: Jun. 3, 2025

(54) SEMICONDUCTOR DEVICE WITH CURRENT CONTROL FOR STANDBY MODE

(71) Applicant: RENESAS ELECTRONICS CORPORATION, Tokyo (JP)

(72) Inventors: Muneaki Tadokoro, Tokyo (JP); Takao Kondo, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 130 days.

(21) Appl. No.: 18/052,384

(22) Filed: Nov. 3, 2022

(65) Prior Publication Data
US 2023/0206960 A1    Jun. 29, 2023

(30) Foreign Application Priority Data
Nov. 15, 2021    (JP) .................... 2021-186023

(51) Int. Cl.
*G11C 5/14*    (2006.01)
*G06F 1/3234*    (2019.01)

(52) U.S. Cl.
CPC ............ *G11C 5/148* (2013.01); *G06F 1/3275* (2013.01)

(58) Field of Classification Search
CPC .. G06F 1/3275; G06F 9/44505; G06F 1/3225; G06F 9/4418; G06F 15/7807; G06F 15/7839; G11C 5/148; G11C 5/144
See application file for complete search history.

(56) References Cited

U.S. PATENT DOCUMENTS

| | | | | |
|---|---|---|---|---|
| 6,169,419 B1* | 1/2001 | De | ..................... | H03K 19/0016 326/50 |
| 7,855,593 B2* | 12/2010 | Azuma | ................... | G11C 5/147 327/544 |
| 7,974,143 B2* | 7/2011 | Lee | ...................... | G11C 7/1051 365/194 |
| 8,422,317 B2* | 4/2013 | Kamp | .................... | G08B 13/06 365/189.16 |
| 8,854,869 B2* | 10/2014 | Komatsu | ............... | G11C 11/417 365/156 |
| 2003/0086278 A1* | 5/2003 | Asami | ................ | G06K 19/0701 363/13 |
| 2004/0257898 A1* | 12/2004 | Ozawa | .................. | G06F 1/3243 365/213 |
| 2007/0025163 A1* | 2/2007 | Partsch | .................. | G11C 5/147 365/189.09 |

(Continued)

FOREIGN PATENT DOCUMENTS

JP    2018-195243 A    12/2018
JP    2019-126131 A    7/2019

OTHER PUBLICATIONS

Notice of Reasons for Refusal received in counterpart Japanese Patent Application No. 2021-186023, mailed Dec. 24, 2024.

*Primary Examiner* — Khamdan N. Alrobaie
(74) *Attorney, Agent, or Firm* — Rimon P.C.

(57) ABSTRACT

A semiconductor device includes a control circuit configured to suppress a current variation by turning on or off a constant current source when transitioning to a standby mode. The control circuit has a function of predicting a current variation value from register information and information of current profile. The control circuit has a function of optimizing single control amount of the current source and the number of times of control of the current source based on the predicted current variation value.

8 Claims, 7 Drawing Sheets

(56) References Cited

U.S. PATENT DOCUMENTS

2009/0251979 A1* 10/2009 Chang .................... G11C 5/147
                                                                                            365/203
2018/0336956 A1   11/2018  Sakumura et al.
2019/0198062 A1    6/2019  Ishikawa

* cited by examiner

SEMICONDUCTOR DEVICE WITH CURRENT CONTROL FOR STANDBY MODE

CROSS-REFERENCE TO RELATED APPLICATIONS

The disclosure of Japanese Patent Application No. 2021-186023 filed on Nov. 15, 2021 including the specification, drawings and abstract is incorporated herein by reference in its entirety.

BACKGROUND

This disclosure relates to a semiconductor device, and is a technique suitably applied to a semiconductor device having a standby mode.

Techniques for stabilizing the internal voltage by controlling the current consumption of a semiconductor device have been proposed. Proposals of this type include, for example, US Patent Application Publication No. 2003/86278 and US Patent Application Publication No. 2019/198062.

There are disclosed techniques listed below.
[Patent Document 1] US Patent Application Publication No. 2003/86278
[Patent Document 2] US Patent Application Publication No. 2019/198062.

SUMMARY

The present disclosers have found that, in a semiconductor device having a standby mode, at the time of transition from a normal operating state to the standby mode or recovery from the standby mode to the normal operating state, the current variation amount (current variation value) exceeds a predetermined specified value in some cases. Namely, for example, since the current variation is controlled with a predetermined setting at the time of transition to the standby mode, a current more than needed is caused to flow wastefully from a current source in some cases depending on the application that has been operated before the standby mode (normal operating state), and it has also been found that there is a waste in the time from the start of the transition to the standby mode to the completion of the transition to the standby mode.

An object of this disclosure is to provide a technique capable of controlling the current variation amount (current variation value) with the optimum width (value) and in the shortest time, at the time of transition from the normal operating state to the standby mode or recovery from the standby mode to the normal operating state.

Other objects and novel features will be apparent from the description of this specification and accompanying drawings.

A typical embodiment of this disclosure will be briefly described as follows.

According to an embodiment, a semiconductor device includes a control circuit configured to suppress current variation by turning on or off a constant current source at time of transition to a standby mode. The control circuit has a function of predicting a current variation value from register information and current profile information. The control circuit has a function of optimizing the single control amount and the number of times of control of the constant current source based on the predicted current variation value.

With the semiconductor device according to the above embodiment, a highly accurate current variation amount (current variation value) can be predicted in advance from an application setting before transition to standby mode without using a dedicated hardware circuit such as a monitor circuit, and the current variation amount (current variation value) can be controlled with the optimum width (value) and in the shortest time at the time of transition from the normal operating state to the standby mode or recovery from the standby mode to the normal operating state.

DETAILED DESCRIPTION

Figure 1:
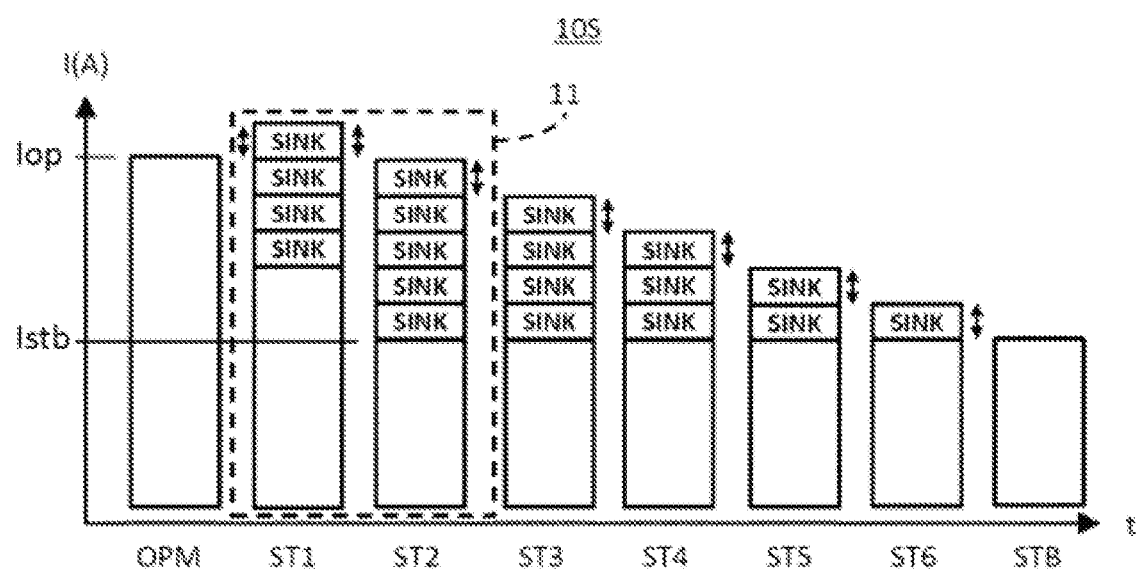
FIG. 1 is a diagram for describing a current variation in a semiconductor device according to a comparative example.

Hereinafter, an embodiment and an example will be described with reference to drawings. However, in the following description, the same components are denoted by the same reference characters and the repetitive description thereof is omitted in some cases. Although the drawings are schematically shown in some cases in comparison to an actual aspect in order to make the description clearer, they are mere an example and do not limit the interpretation of the present invention.

Before the description of the embodiment according to this disclosure, a semiconductor device according to the technique studied by the disclosers (hereinafter, referred to also as comparative example) will be described with reference to FIG. 1 in order to make this disclosure easily understood. FIG. 1 is a diagram for describing a current variation in a semiconductor device according to a comparative example. FIG. 1 shows a current variation in a semiconductor device 10S when the semiconductor device 10S transitions from a normal operating state OPM to a standby mode (referred to also as standby state) STB. The vertical axis represents current (I(A)) and the horizontal axis represents time (t). In FIG. 1, the semiconductor device 10S transitions from the normal operating state OPM to the standby mode STB through six operating states, that is, a first state ST1 to a sixth state ST6. The current consumption when the semiconductor device 10S is in the normal operating state OPM is indicated as Iop, and the current consumption when the semiconductor device 10S is in the standby state STB is indicated as Istb. SINK indicates a current source in an on-state.

As shown in FIG. 1, in the semiconductor device 10S of the comparative example, when transitioning from the normal operating state OPM to the first state ST1, four current sources SINK are turned on, and the current consumption of the semiconductor device 10S increases by the amount corresponding to one SINK as compared with the current consumption Iop in the normal operating state OPM. Thereafter, when transitioning from the first state ST1 to the second state ST2, five current sources SINK are turned on, and the current consumption of the semiconductor device 10S becomes substantially the same as the current consumption Iop in the normal operating state OPM. Then, the state of the semiconductor device 10S sequentially changes from the second state ST2 to the third state ST3, the fourth state ST4, the fifth state ST5, and the sixth state ST6, and transitions to the standby state STB. Here, the number of current sources SINK in an on-state decreases one by one from four to zero.

As described above, in the semiconductor device 10S of the comparative example, the current variation is controlled with a fixed setting, so the current sources SINK wastefully flow a current depending on the application. Moreover, there is a waste in the transition time from the normal operating state OPM to the standby mode STB. In FIG. 1, the states ST1 and ST2 surrounded by a rectangular dotted line 11 can be said to be wasteful states and wasteful time.

EMBODIMENT

Figure 2:
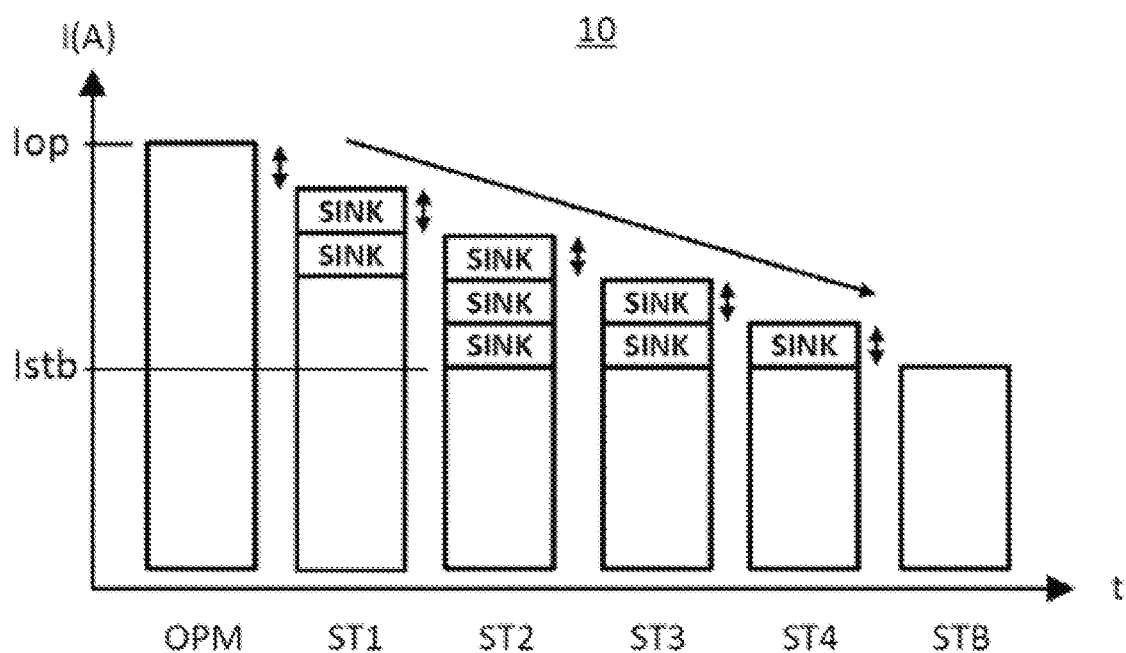
FIG. 2 is a diagram for describing a current variation in a semiconductor device according to an embodiment.

FIG. 2 is a diagram for describing a current variation in a semiconductor device according to an embodiment. FIG. 2 shows a current variation in a semiconductor device 10 according to the embodiment when the semiconductor device 10 transitions from a normal operating state OPM to a standby mode STB. The vertical axis represents current (I(A)) and the horizontal axis represents time (t). In FIG. 2, the semiconductor device 10 transitions from the normal operating state OPM to the standby mode STB through four operating states, that is, a first state ST1 to a fourth state ST4. The current consumption when the semiconductor device 10 is in the normal operating state OPM is indicated as Iop, and the current consumption when the semiconductor device 10 is in the standby state STB is indicated as Istb. SINK indicates a current source in an on-state.

As shown in FIG. 2, in the semiconductor device 10, when transitioning from the normal operating state OPM to the first state ST1, two current sources SINK are turned on, and the current consumption of the semiconductor device 10 decreases as compared with the current consumption Iop in the normal operating state OPM. Thereafter, when transitioning from the first state ST1 to the second state ST2, three current sources SINK are turned on, but the current consumption of the semiconductor device 10 in the second state ST2 decreases as compared with the current consumption in the first state ST1 by, for example, the amount corresponding to one current source SINK. Then, the state of the semiconductor device 10 sequentially changes from the second state ST2 to the third state ST3 and the fourth state ST4, and transitions to the standby state STB. Here, the number of current sources SINK in an on-state decreases one by one from three to zero.

As described above, the semiconductor device 10 according to the embodiment is configured to perform control by variably predicting the number of current sources SINK controlled in single process and the number of steps. In addition, the semiconductor device 10 according to the embodiment is configured such that there is no waste in the transition time from the normal operating state OPM to the standby mode STB.

(Configuration Example of Semiconductor Device)

Figure 3:
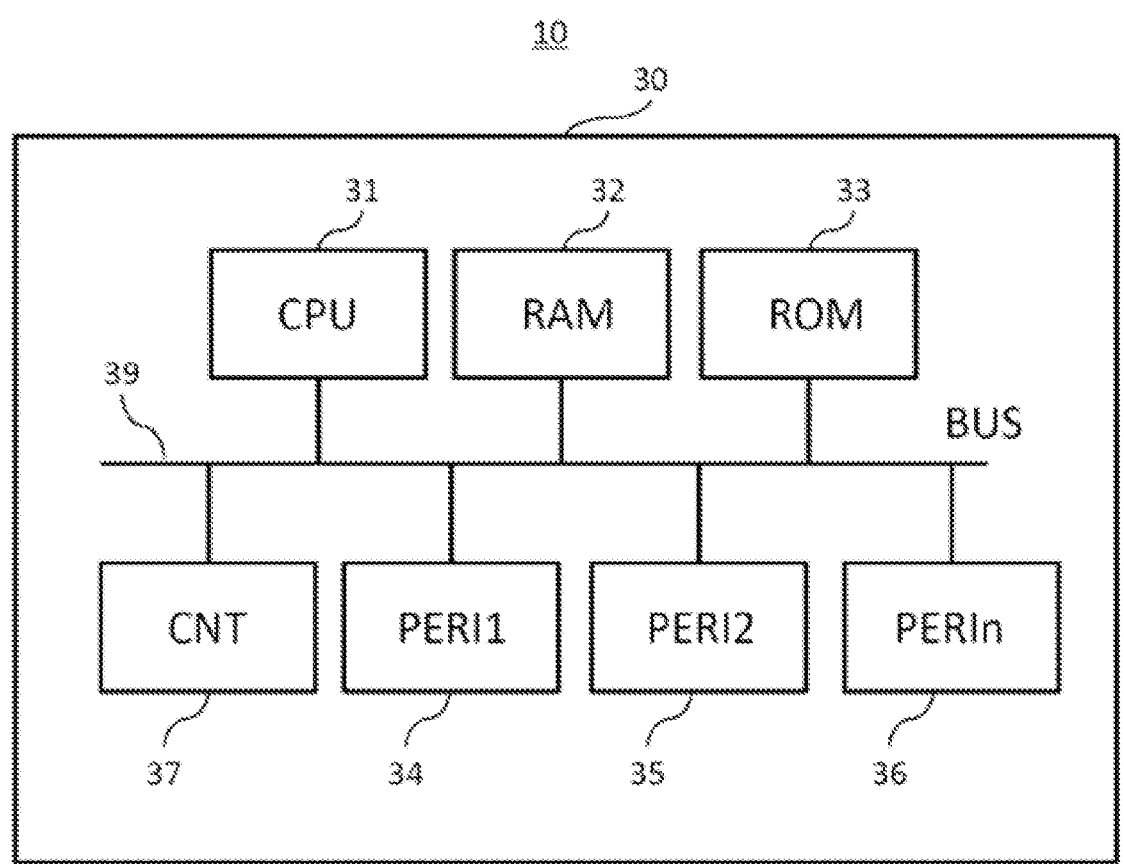
FIG. 3 is a block diagram showing a configuration example of the semiconductor device according to the embodiment.

FIG. 3 is a block diagram showing a configuration example of the semiconductor device according to the embodiment. The semiconductor device 10 is formed in a rectangular semiconductor chip 30 made of single crystal silicon. The semiconductor device 10 includes a central processing unit (CPU) 31, a volatile memory (RAM) 32 such as a static random access memory (SRAM), and a nonvolatile memory (ROM) 33 such as a flash memory or read only memory. The semiconductor device 10 further includes a plurality of peripheral circuits (RERI1, PERI2, PERIn) 34, 35, and 36, a control circuit (CNT) 37, and a bus 39. The bus 39 interconnects the central processing unit 31, the volatile memory 32, the nonvolatile memory 33, the peripheral circuits 34, 35, and 36, and the control circuit 37.

The central processing unit 31 performs desired control by executing the operation control program stored in the nonvolatile memory 33. The volatile memory 32 is used as a temporary data storage location for the central processing unit 31. The peripheral circuits 34, 35, and 36 may be presented as timer circuits, communication circuits, analog-to-digital conversion circuits, digital-to-analog conversion circuits, and the like.

The control circuit 37 is a control circuit that controls or suppresses the current variation in the semiconductor device 10 when transitioning from the normal operating state OPM to the standby mode STB described in FIG. 2.

Figure 4:
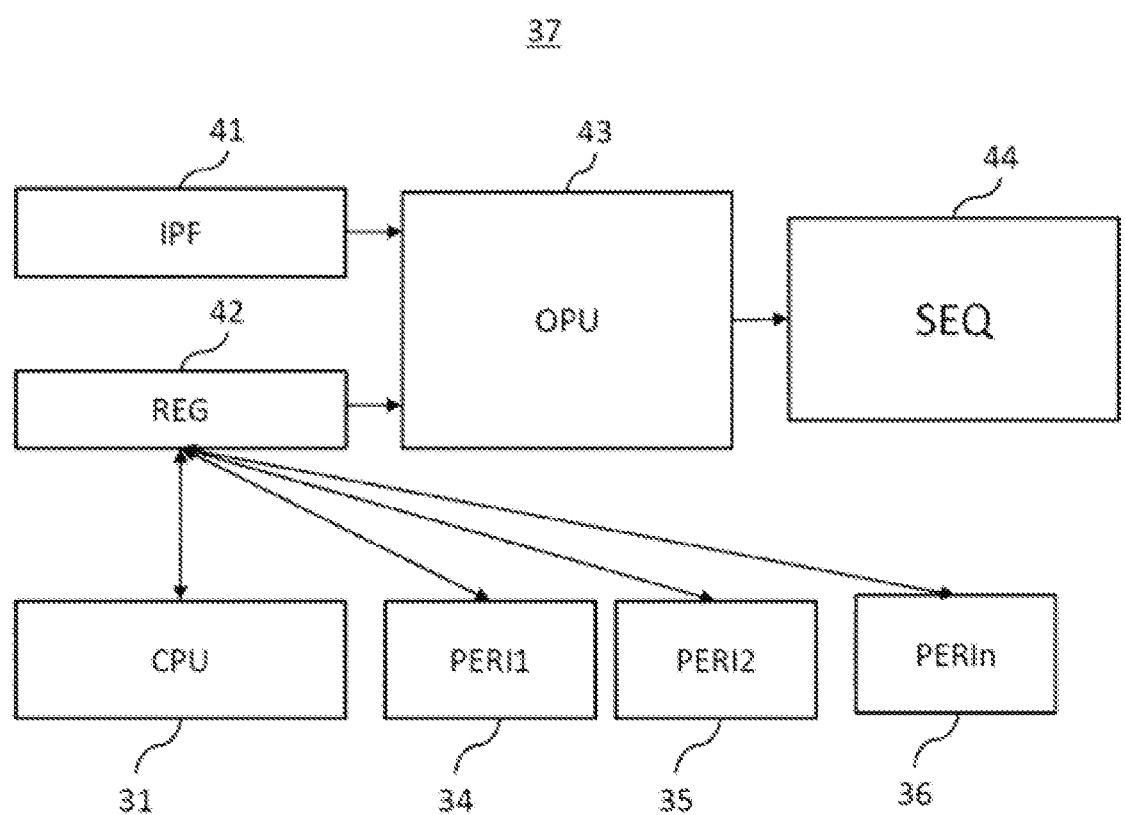
FIG. 4 is a diagram for describing a configuration example of the control circuit in FIG. 3.
Figure 5:
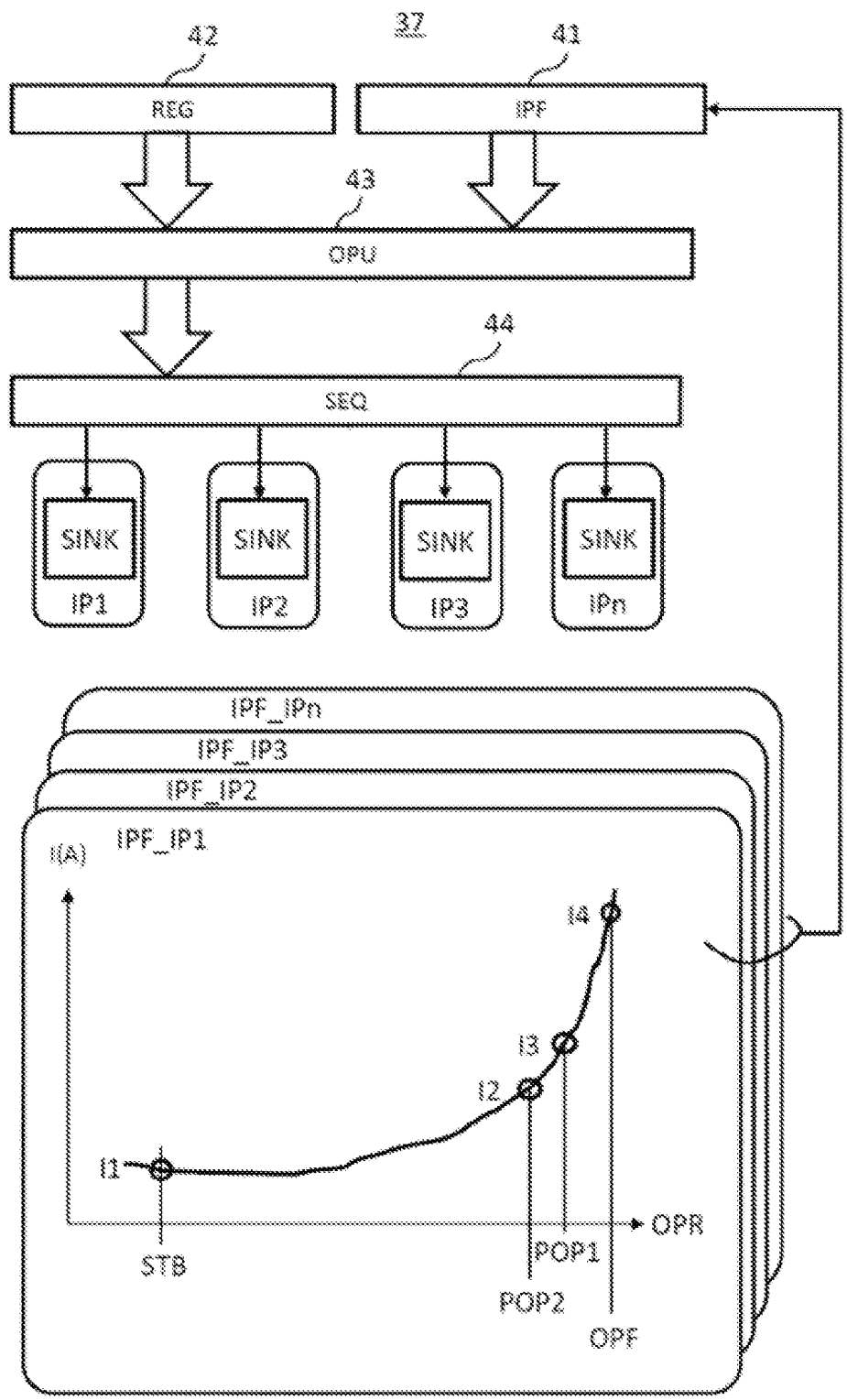
FIG. 5 is another diagram for describing a configuration example of the control circuit in FIG. 3.

Next, a configuration example and an operation example of the control circuit 37 will be described with reference to FIG. 4 and FIG. 5. FIG. 4 is a diagram for describing a configuration example of the control circuit in FIG. 3. FIG. 5 is another diagram for describing the configuration example of the control circuit in FIG. 3.

As shown in FIG. 4 and FIG. 5, the control circuit 37 includes a memory device 41 for storing information of current profile IPF, a setting register (REG) 42, an arithmetic circuit (OPU) 43 for predicting the current variation value, and a sequencer (SEQ) 44 that controls on/off of the current source SINK. It can also be said that the arithmetic circuit 43 is a current variation prediction controller and the sequencer 44 is a current source controller.

The memory device 41 stores first information such as the current profile IPF tabulated from current evaluation result at the time of design of the plurality of circuit blocks (here, referred to as IP) mounted in the semiconductor device 10 such as the central processing unit 31, the volatile memory 32, the nonvolatile memory 33, and the peripheral circuits 34, 35, and 36, an assurable current variation width, and information of the number of mounted current sources SINK of each IP (31, 34-36). Namely, the memory device 41 stores the information of the current profile IPF of each IP. The information of the current profile IPF can be restated as table data.

Since the current profile IPF changes or varies depending on the products, it is preferable that the memory device 41 is composed of an electrically rewritable nonvolatile memory such as a flash memory. In this way, the information of the current profile IPF stored in the electrically rewritable nonvolatile memory can be, for example, the readable information and the rewritable information.

FIG. 5 exemplarily shows a state in which the memory device 41 stores the current profiles IPF of four IPs (IP1-IP4). The current profiles IPF of IP1 to IP4 are denoted as IPF_IP1, IPF_IP2, IPF_IP3, and IPF_IPn, respectively. As representatively shown in the current profile IPF_IP1 of IP1, the current profiles IPF_IP1, IPF_IP2, IPF_IP3, and IPF_IPn each can be presented as the table including the information of the current value I1 (or current range) of IP1 in the standby state, the current value I2 (or current range) of IP1 at the partial operation POP2, the current value I3 (or current range) of IP1 at the partial operation POP1, and the current value I4 (or current range) of IP1 at the full operation OPF. In the current profile IPF_IP1 of FIG. 5, a graph representing the current of the IP (I(A)) on the vertical axis and the operation rate OPR of the IP on the horizontal axis is illustrated as an example.

The setting register 42 stores register information such as information of operation clock sources and frequency division ratios of the central processing unit 31 and the peripheral circuits 34, 35, and 36 (referred to also as clock setting information regarding frequency setting), information as to whether each IP (31, 34-36) continues operation during standby (referred to also as standby setting information regarding activation during standby), and information of the operation mode of each IP. The register information stored in the setting register 42 can be restated as second information. Of course, the setting register 42 may be composed of an electrically rewritable nonvolatile memory such as a flash memory, like the memory device 41.

Although the volatile memory 32 and the nonvolatile memory 33 are not shown in FIG. 4, when the volatile memory 32 and the nonvolatile memory 33 are transitioned to the standby mode, the current profiles IPF of the volatile memory 32 and the nonvolatile memory 33 are stored in the memory device 41, and information such as the operation clock sources and frequency division ratios of the volatile memory 32 and the nonvolatile memory 33, information as to whether the volatile memory 32 and the nonvolatile memory 33 continue the operation during standby, and information of the operation mode of the volatile memory 32 and the nonvolatile memory 33 are stored in the setting register 42.

The arithmetic circuit 43 determines sequence information by predicting the current variation width during a series of sequences when transitioning from the normal operating state OPM to the standby mode STB based on input information such as each current profile IPF of the memory device 41 and the contents of the setting register 42. Here, as the sequence information, the number of current sources SINK to be turned on (or off) (referred to also as the single control amount of the current sources SINK) and the number of steps when transitioning from the normal operating state OPM to the standby mode STB (the number of times of control or the number of states: ST1-ST4, see FIG. 2) are determined.

In accordance with the sequence information calculated by the arithmetic circuit 43, the sequencer 44 controls the on/off of the current of the current sources SINK provided in each IP (IP1-IP4) with the arbitrary number of current sources SINK and the arbitrary number of steps as shown in FIG. 5. Although FIG. 5 shows as if each IP is provided with one current source SINK, the number of current sources SINK may be two, three, or more.

In this way, it is possible to realize the current variation when the semiconductor device 10 transitions from the normal operating state OPM to the standby mode STB as shown in FIG. 2.

(Control Method of Semiconductor Device)

Figure 6:
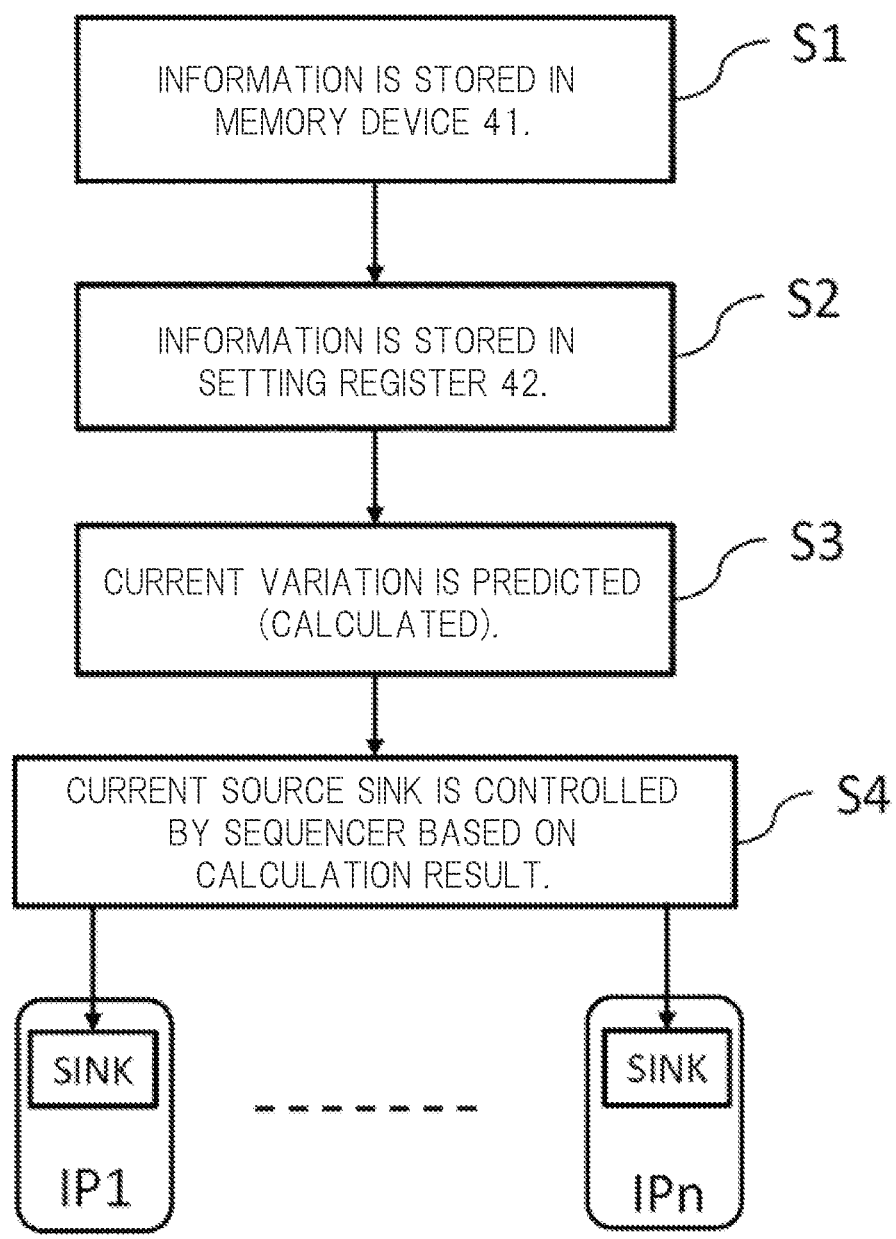
FIG. 6 is a diagram for describing a control method of the semiconductor device according to the embodiment.
Figure 7:
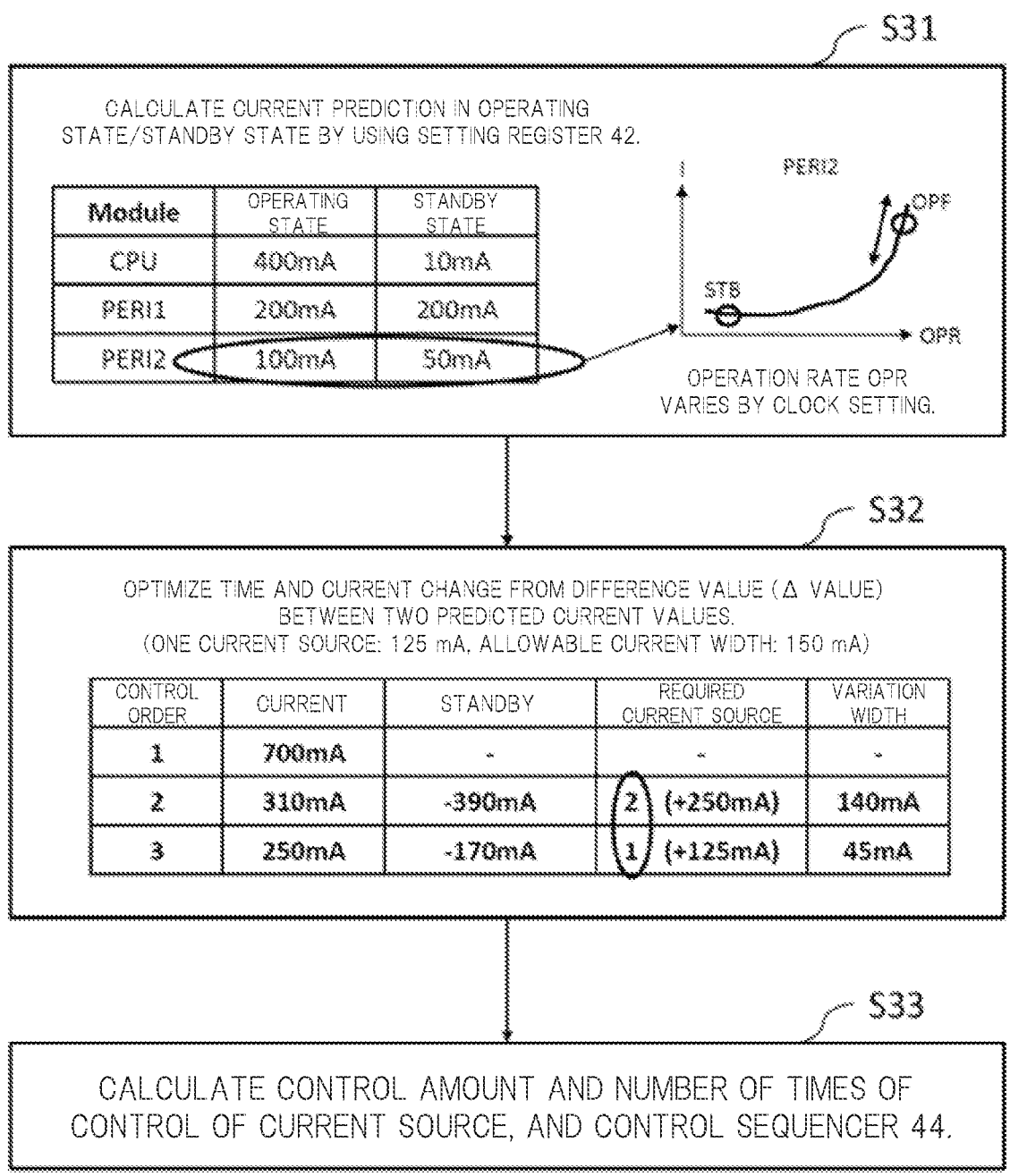
FIG. 7 is a diagram for describing a step S3 in the control method in FIG. 6.

Next, a control method of the semiconductor device 10 according to the embodiment will be described with reference to FIG. 6 and FIG. 7. FIG. 6 is a diagram for describing a control method of the semiconductor device according to the embodiment. FIG. 7 is a diagram for describing a step S3 in the control method in FIG. 6.

(Step S1)

The first information is stored in the memory device 41 of the control circuit 37. Since the memory device 41 varies depending on the products, it is preferable to store the first information in a flash memory or the like so as to be able to respond flexibly. The first information stored in the memory device 41 includes the tabulated information of the current profile IPF of each IP (IP1-IPn: 31, 34-36), the assurable current variation width, the information of the number of mounted current sources SINK of each IP (IP1-IPn), and others.

(Step S2)

Next, the register information (second information) is stored in the setting register 42. The second information includes the clock information of each IP (IP1-IPn), the operation permission information of each IP (IP1-IPn) during normal operation (OPM) and standby (STB), the information of the operating mode of each IP (IP1-IPn), and others.

(Step S3)

Next, the arithmetic circuit 43 calculates optimum control based on the first information of the memory device 41 and the second information of the setting register 42. The arithmetic circuit 43 determines the number of current sources SINK to be turned on (or off) and the number of steps (number of states: ST1-ST4, see FIG. 2) when transitioning from the normal operating state OPM to the standby mode STB.

Step S3 includes steps S31, S32, and S33, as shown in FIG. 7.

(Step S31)

The arithmetic circuit 43 calculates the current prediction of the normal operating state (OPM) and the standby state (STB) by using the tabulated information of the current profile IPF of each IP (IP1-IPn: 31, 34-36) stored in the setting register 42.

For example, in the tabulated information (table data), in this example, the current consumption of the central processing unit CPU is 400 mA during the normal operation (OPM) and is 10 mA during the standby (STB). The current consumption of the peripheral circuit 1 (PERI1) is 200 mA during the normal operation (OPM) and is 200 mA during the standby (STB). The current consumption of the peripheral circuit 2 (PERI2) is 100 mA during the normal operation (OPM) and is 50 mA during the standby (STB). Further, the peripheral circuit 2 (PERI2) is configured such that the operation rate OPR varies depending on the clock setting.

(Step S32)

The arithmetic circuit 43 optimizes the time and the current change based on the difference value ($\Delta$ value) between the two predicted currents of step S31 (the current in the normal operating state (OPM) and the current in the standby state (STB)). The control order optimized by the arithmetic circuit 43 is shown in the portion of step S32 in FIG. 7. Here, the current for one current source SINK is, for example, 125 mA, and the allowable current width is, for example, 150 mA.

The part whose control order is 1 is the normal operating state (OPM), and the current consumption is 700 mA.

The part whose control order is 2 is referred to as a first step from the normal operating state (OPM), and for example, the central processing unit CPU is transitioned from the normal operating state (OPM) to the standby state (400 mA−390 mA=10 mA). In this case, the current consumption value of the semiconductor device 10 in the first step is 310 mA, and the current consumption value of the semiconductor device 10 is reduced by 390 mA from the normal operating state (OPM) (700 mA−310 mA=390 mA). Since the change in current value is 390 mA and the allowable current width is 150 mA, the change width (390 mA) in current value is greater than the allowable current width (150 mA) (390 mA>150 mA). Therefore, only two current sources SINK in the central processing unit CPU (in IP) or in the semiconductor device 10 are turned on. Since the current when the two current sources SINK are turned on is 250 mA (=125 mA×2), 390 mA−250 mA=140 mA<150 mA holds. Therefore, in the part whose control order is 2, it is preferable to turn on the two current sources SINK while setting the central processing unit CPU in the standby state.

The part whose control order is 3 is referred to as a second step from the normal operating state (OPM), and for example, the peripheral circuit 2 (PERI2) is transitioned from the normal operating state (OPM) to the standby state. Here, it is assumed that the current consumption is reduced by 170 mA from the current consumption value of 310 mA in the first step when the peripheral circuit 2 (PERI2) is transitioned from the normal operating state (OPM) to the standby state. Further, it is assumed that the current consumption of the semiconductor device 10 in the second step is 250 mA. Since the change in current value is 170 mA and the allowable current width is 150 mA, the change width (170 mA) in current value is greater than the allowable current width (150 mA) (170 mA>150 mA). Therefore, only one current source SINK in PERI2 (in IP) or in the semiconductor device 10 is turned on. Since the current when one current source SINK is turned on is 125 mA, 170 mA−125 mA=45 mA<150 mA holds. Therefore, in the part whose control order is 3, it is preferable to turn on one current source SINK while setting the CPU and PERI2 in the standby state.

(Step S33)

The arithmetic circuit 43 calculates the control amount and the number of times of control (number of steps) of the current source SINK as sequence information according to the control orders 1, 2, and 3 from the result of step S32. Then, the arithmetic circuit 43 controls the sequencer 44 based on the calculated sequence information. In other words, the arithmetic circuit 43 of the control circuit 37 has an adjustment function in accordance with the allowable current value and the performance of the current source SINK.

(Step S4)

The sequencer 44 controls the on-state and off-state of the current of the current sources SINK provided in each IP (IP1-IPn) with the arbitrary number of current sources SINK and the number of steps in accordance with the sequence information calculated by the arithmetic circuit 43.

Figure 8:
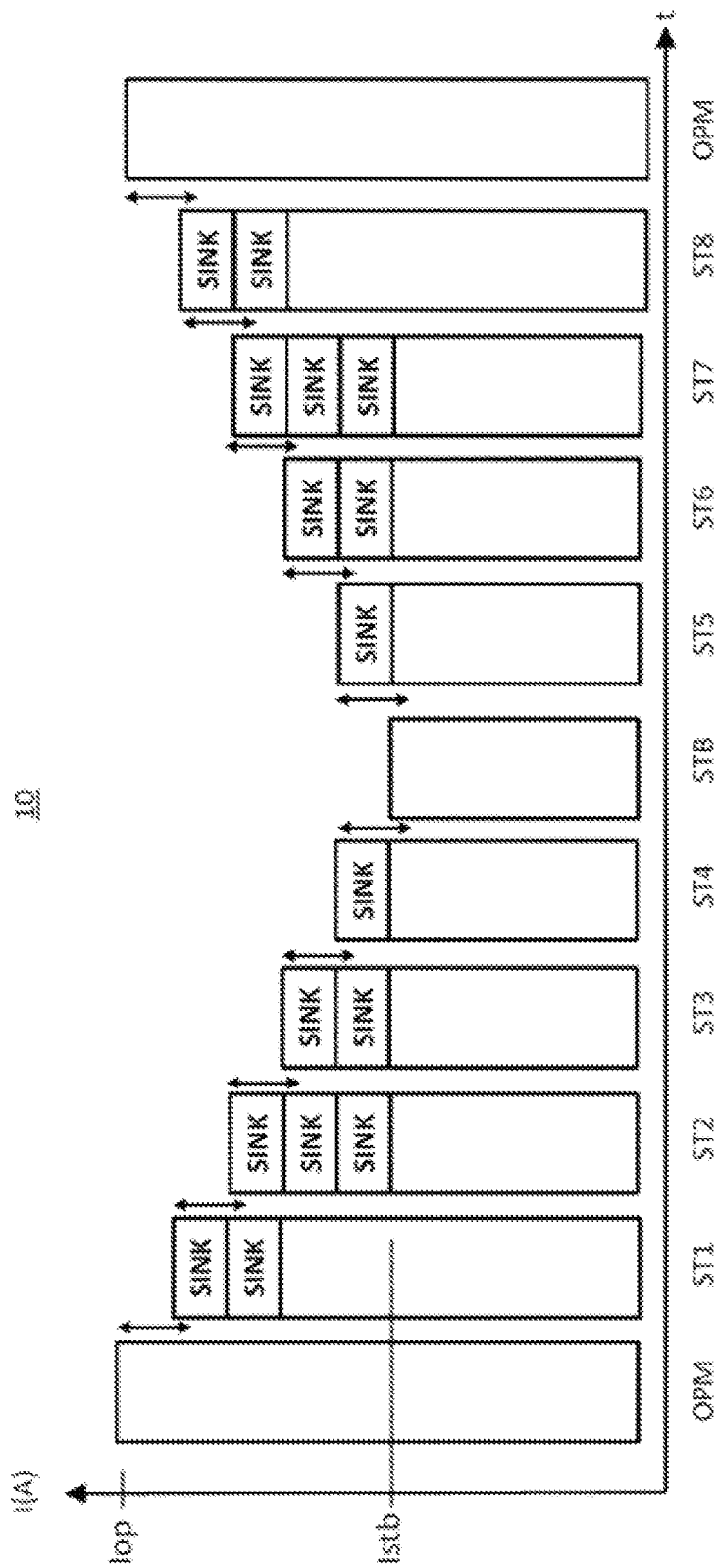
FIG. 8 is a diagram for describing a current variation at the time of transition to a standby mode and recovery from the standby mode in the semiconductor device according to the example.

FIG. 8 is a diagram for describing a current variation in the semiconductor device according to the embodiment. FIG. 8 shows the current variation in the semiconductor device 10 in the case of transitioning from the normal operating state OPM to the standby mode STB through the states ST1, ST2, ST3, and ST4, and then recovering from the standby mode STB to the normal operating state OPM through the states ST5, ST6, ST7, and ST8.

As described above, in the current variation in the semiconductor device 10 according to the embodiment, the arithmetic circuit 43 accurately predicts the current variation amount (current variation value) in advance from the application setting (first information of the memory device 41, second information of the setting register 42) before the transition to the standby mode STB, without any awareness by the user. As a result, a dedicated monitor clock circuit is not required, and the current variation amount at the time of transition to the standby mode STB and recovery to the standby mode STB can be controlled with the optimum width and in the shortest time.

The semiconductor device 10, for example, an MCU (microcontroller) for automobiles is becoming larger in scale due to cross-domain compatibility and host system integration, and the importance to the current variation is also increasing together with the increase in current consumption. In order to deal with current variations, an expensive power supply control system and a large-capacity capacitor that are resistant to current variations are generally required outside the semiconductor device. Alternatively, as in Patent Documents 1 and 2, it is necessary to perform control by mounting a dedicated monitor component inside the semiconductor device.

The semiconductor device 10 according to the embodiment does not require a dedicated monitor circuit inside it, and the specifications of the current sources SINK and the number of current sources SINK for current adjustment can be optimized. Therefore, since the manufacturing cost of the semiconductor device 10 can be minimized and control using inexpensive external power supply components is possible, the total cost of electronic control unit (ECU) for automobiles employing the semiconductor device 10 can be reduced.

In addition, in the semiconductor device 10 according to the embodiment, the control circuit 37 accurately predicts the current variation amount in advance, and controls the current variation amount at the time of transition to the standby mode STB and recovery to the standby mode STB with the optimum width and in the shortest time. Therefore, the customer who designs the electronic control unit (ECU) does not need to tune the current variation amount or the like, and thus the customer's development cost of the electronic control unit (ECU) is not affected.

In the foregoing, the disclosure made by the disclosers has been specifically described based on the embodiment and example, but it goes without saying that the disclosure is not limited to the embodiment and example described above and can be modified in various ways.

What is claimed is:

1. A semiconductor device comprising a control circuit configured to suppress a current variation by turning on or off current sources when transitioning to a standby mode,
    wherein the control circuit has a function of predicting a current variation value from register information and information of current profile, and
    wherein the control circuit has a function of optimizing a number of the current sources and a number of times of each of the current sources is controlled based on the predicted current variation value.

2. The semiconductor device according to claim 1, wherein the register information includes clock setting information regarding frequency setting and standby setting information regarding activation during standby.

3. The semiconductor device according to claim 1, wherein the information of the current profile is composed of table data for each of a plurality of IPs provided in the semiconductor device.

4. The semiconductor device according to claim 3, further comprising an electrically rewritable nonvolatile memory configured to store the information of the current profile.

5. The semiconductor device according to claim 1, wherein the control circuit has an adjustment function in accordance with an allowable current value and a performance of each of the current sources.

6. A semiconductor device comprising:
a plurality of circuit blocks including current sources; and
a control circuit configured to suppress a current variation by turning on or off each of the current sources when transitioning to a standby mode,
wherein the control circuit includes:
   a memory device configured to store information of current profile of each of the plurality of circuit blocks;
   a setting register configured to store register information of each of the plurality of circuit blocks;
   an arithmetic circuit configured to predict a current variation value from the register information and the information of the current profile and calculate a number of the current sources and a number of times of control of each of the current sources as sequence information; and
   a sequencer configured to control on/off of the current sources provided in the plurality of circuit blocks using the number of current sources and the number of times of each of the current sources is controlled based on the sequence information.

7. The semiconductor device according to claim 6, wherein the memory device is composed of an electrically rewritable nonvolatile memory.

8. The semiconductor device according to claim 6, wherein the register information includes:
information of an operation clock source and a frequency division ratio of each of the plurality of circuit blocks;
standby setting information regarding activation during standby of each of the plurality of circuit blocks; and
information of an operation mode of each of the plurality of circuit blocks.

* * * * *